United States Patent
Kwon

(10) Patent No.: US 7,129,556 B2
(45) Date of Patent: Oct. 31, 2006

(54) METHOD FOR FABRICATING ARRAY SUBSTRATE FOR X-RAY DETECTOR

(75) Inventor: Keuk-Sang Kwon, Kumi (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/436,070

(22) Filed: May 13, 2003

(65) Prior Publication Data

US 2003/0199117 A1    Oct. 23, 2003

Related U.S. Application Data

(62) Division of application No. 09/750,074, filed on Dec. 29, 2000, now Pat. No. 6,607,935.

(30) Foreign Application Priority Data

Dec. 31, 1999  (KR) .................................. 99-67850

(51) Int. Cl.
    *H01L 31/00* (2006.01)
(52) U.S. Cl. .................. 257/443; 438/149; 438/151; 438/608; 438/609; 257/E29.117
(58) Field of Classification Search .................. 438/66, 438/69, 73, 80, 740, 149, 151, 164, 396, 438/608, 609; 257/443, 444, E29.117, E29.273
See application file for complete search history.

(56) References Cited

U.S. PATENT DOCUMENTS

| | | | | |
|---|---|---|---|---|
| 5,478,766 A | * | 12/1995 | Park et al. .................. 438/158 |
| 5,731,216 A | * | 3/1998 | Holmberg et al. ............ 438/30 |
| 5,798,534 A | * | 8/1998 | Young .......................... 257/59 |
| 5,963,797 A | * | 10/1999 | Hyun .......................... 438/149 |
| 6,218,221 B1 | * | 4/2001 | Sah ............................. 438/158 |
| 6,317,173 B1 | * | 11/2001 | Jung et al. ..................... 349/42 |
| 6,507,896 B1 | * | 1/2003 | Sanada et al. ............. 711/152 |
| 6,509,939 B1 | * | 1/2003 | Lee et al. ...................... 349/39 |
| 6,528,819 B1 | * | 3/2003 | Choo et al. ................... 257/59 |
| 6,569,720 B1 | * | 5/2003 | Kunii .......................... 438/151 |
| 6,607,935 B1 | * | 8/2003 | Kwon .......................... 438/56 |
| 6,862,050 B1 | * | 3/2005 | Rho et al. ..................... 349/44 |
| 6,924,179 B1 | * | 8/2005 | Oh et al. ..................... 438/157 |
| 6,969,889 B1 | * | 11/2005 | Cho et al. ................... 257/347 |
| 2001/0014493 A1 | * | 8/2001 | Inoue et al. ................ 438/149 |
| 2002/0113239 A1 | * | 8/2002 | Uochi et al. .................. 257/72 |

\* cited by examiner

*Primary Examiner*—Matthew Smith
*Assistant Examiner*—Khiem Nguyen
(74) *Attorney, Agent, or Firm*—McKenna Long & Aldridge LLP

(57) ABSTRACT

An array substrate for use in an X-ray sensing device is fabricated using an etching stopper that enables good control of the etching process and that prevents over-etch of drain electrodes and second capacitor electrodes while forming contact holes and a cutting furrow. The etching stopper is located in a tiling portion that is utilized for tiling substrates to form a large-sized X-ray detector. During fabrication, gate lines can have gate-protruded portions located near the etching stopper, and the etching stopper can have stopper-protruded portions near the gate lines. The stopper-protruded portions electrically connect to the gate-protruded portions through gate line contact holes such that the etching stopper and the gate lines have equipotentials. This can reduce static electricity damage.

13 Claims, 8 Drawing Sheets

METHOD FOR FABRICATING ARRAY SUBSTRATE FOR X-RAY DETECTOR

CROSS REFERENCES TO RELATED APPLICATIONS

This application is a divisional application of Ser. No. 09/750,074 filed on Dec. 29, 2000, U.S. Pat. No. 6,607,935 which is hereby incorporated by reference as if fully set forth herein.

This application claims the benefit of Korean Patent Application No. 1999-67850, filed on Dec. 31, 1999, which is hereby incorporated by reference for all purposes as if fully set forth herein.

BACKGROUND OF THE INVENTION

1. Field of the Invention

The present invention relates to X-ray detectors. More particularly, it relates to Thin Film Transistor (TFT) array substrates for use in X-ray detectors.

2. Description of Related Art

A widely used method of medical diagnosis is the X-ray film. As such films produce photographic images, time consuming film-processing procedures are required to obtain the results. However, digital X-ray sensing devices (referred to hereinafter as X-ray detectors) that employing thin film transistors have been recently developed. Such X-ray sensing devices have the advantage of providing real time diagnosis.

FIG. 1 is a cross-sectional view illustrating one pixel of an array substrate of a conventional X-ray sensing device. That X-ray sensing device includes a Thin Film Transistor (TFT) "T" on a substrate 1, a photoconductive film 2, and various conductive elements that are described subsequently. Also included, but not shown in FIG. 1, are a scanning integrated circuit and a data integrated circuit.

Referring to FIG. 1, the photoconductive film 2 produces electron-hole pairs 6 in proportion to the strength of external radiation. Thus, the photoconductive film 2 acts as a photoelectric transducer that converts incident X-rays into electron-hole pairs 6. An external voltage Ev is applied across a conductive electrode 7 and a pixel electrode 62. That voltage causes the electron-hole pairs 6 in the photoconductive film 2 to separate such that X-ray induced electrical charges accumulate in the pixel electrode 62. Those electrical charges are applied to a second capacitor electrode 60, and are consequently stored in a storage capacitor "S" formed by the second capacitor electrode 60 and a first capacitor electrode 58 that is formed over a ground line 42. The pixel electrode 62, the first capacitor electrode 58 and the second capacitor electrode 60 are beneficially comprised of a transparent conductive material such as Indium-Tin-Oxide (ITO) or Indium-Zinc-Oxide (IZO). Furthermore, an insulating dielectric layer 15 is interposed between the first capacitor electrode 58 and the second electrode 60. That dielectric layer is beneficially comprised of Silicon Nitride ($SiN_x$).

Still referring to FIG. 1, the TFT "T" connects to the storage capacitor "S" such that electrical charges accumulated on the storage capacitor "S" can flow through the TFT "T" and into the data integrated circuit (not shown) when the TFT "T" is turned ON by the scanning integrated circuit (not shown).

FIG. 2 is a plan view illustrating several pixels of an array substrate for an X-ray sensing device according to the conventional art. Gate lines 50 are arranged in a transverse direction and data lines 53 are arranged in a longitudinal direction. Gate pads 87 are formed at each end of each gate line 50. Those gate pads are associated with gate pad contact holes 96. The gate pads formed at one end of the gate line are cut off during a subsequently process of bonding two substrates to form a large substrate, following a short/open-circuit test. The cutting portion, called a tiling portion "A," is used for tiling array substrates to form a large-sized X-ray image detector. External drive circuitry (not shown) connects to the other gate pads 87 through the gate pad contact holes 96 using a Wire Bonding method. The gate pads 87 also connect to a gate shorting bar that makes the gate pads have equipotentials. The shorting bar is used during the short/open-circuit testing.

A TFT "T" is formed near each crossing of the gate and data lines 50 and 53 (for simplicity only one TFT "T" is shown in detail in FIG. 2). Each TFT acts as a switching element. A ground line 42 is arranged perpendicular to the gate lines 50. The ground line 42 acts as a common line for the neighboring pixels.

A first capacitor electrode 58 and a second capacitor electrode 60 of a storage capacitor "S" are located in each pixel area, with the pixel areas being the regions between the gate lines and the data lines. Additionally, as shown in FIG. 1 but not shown in FIG. 2, a dielectric layer 15 of Silicon Nitride ($SiN_x$) is interposed between first capacitor electrodes 58 and the second capacitor electrodes 60. Pixel electrodes 62 that extend over the TFTs "T" are then located in the pixel areas. Although not shown in FIG. 2, but as shown in FIG. 1, in order to store the holes which are generated in the photoconductive film 2, each pixel electrode 62 electrically connects to the second capacitor electrode 60 of that pixel. Furthermore, each pixel electrode 62 is electrically connected to a drain electrode 33 of that pixel's TFT "T" via a drain contact hole 85.

The fabrication steps of the array substrate illustrated in FIG. 2 will be explained with reference to FIGS. 3A to 3E, which are cross-sectional views taken along lines I—I, II—II and III—III.

Referring to FIG. 3A, a first metal layer is formed on a substrate 71 by depositing a metallic material such as Aluminum (Al), Al-alloy, Molybdenum (Mo), Tantalum (Ta), Tungsten (W) or Antimony (Sb). A gate line 50, a gate electrode 73 that extends from the gate line 50, and a gate pad (not shown) on each end of the gate line 50 are then formed by patterning the first metal layer. Simultaneously formed are a shorting bar (not shown) and a shorting bar connector (also not shown) that connects the gate pads to the shorting bar. Then, a first insulation layer 75 is deposited over the substrate 71 and over the first metal layer. The first insulation layer 75 can be comprised of an inorganic substance, such as silicon Nitride ($SiN_x$) or Silicon Oxide ($SiO_x$), or of an organic substance such as BCB (Benzocyclobutene) or an acryl. Silicon Nitride ($SiN_x$) is assumed to be employed hereinafter.

As shown in FIG. 3B, a pure amorphous silicon (a-Si:H) layer and a doped amorphous silicon ($n^+$ a-Si:H) layer are sequentially formed over the first insulation layer 75. Those silicon layers are then patterned to form an active layer 86 and an ohmic contact layer 91. CVD (Chemical Vapor Deposition) or the Ion Injection Method is beneficially used to form the doped amorphous silicon layer.

Referring now to FIG. 3C, a source electrode 32, a drain electrode 33, and a ground line 42 are then formed. First, a second conductive metal layer of Aluminum (Al), Al-alloy, Molybdenum (Mo), Tantalum (Ta), Tungsten (W) or Antimony (Sb) is deposited. The second conductive metal layer is then patterned to form the source electrode 32, which extends from the data line (reference element 53 of FIG. 2) over the gate electrode 73; the drain electrode 33, which is spaced apart from the source electrode 32 and over the gate electrode 73; and the ground line 42, which crosses under the storage capacitor "S" (see FIG. 2). A portion of the ohmic contact layer 91 on the active layer 86 is then etched to form a channel region using the source and drain electrodes 32 and 33 as masks. Thus, the TFT "T" (see FIG. 2) is complete.

Next, the first capacitor electrode 58 is formed over the ground line 42 by depositing and patterning a transparent conductive material such as Indium-Tin-Oxide (ITO) or Indium-Zinc-Oxide (IZO). The first capacitor electrode 58 is in electrical contact with the ground line 42. A dielectric protection layer 81 is then formed over the TFT, over the first capacitor electrode 58, and over the first insulation layer 75 by depositing Silicon Nitride ($SiN_x$). Thus, the first insulation layer 75 and the protection layer 81 are stacked over the gate pad (see FIG. 2) and over the gate line 50. A second capacitor electrode 60, which corresponds in size to the first capacitor electrode 58, is then formed on the protection layer 81 and over the first capacitor electrode 58. The second capacitor electrode 60 is beneficially comprised of Indium-Tin-Oxide (ITO) or of Indium-Zinc-Oxide (IZO).

As shown in FIG. 3D, a second insulation layer 83 is then formed, beneficially by depositing an organic substance such as BCB (Benzocyclobutene). BCB is a good choice because it has a low dielectric permittivity. After that, the second insulation layer 83 and the protection layer 81 are etched to form a drain contact hole 85 over the drain electrode 33. Simultaneously, a capacitor electrode contact hole 95 is formed by etching the second insulation layer 83 over the second capacitor electrode 60. Also simultaneously, by etching the second insulation layer 83, the protection layer 81, and the first insulation layer 75, a cutting furrow 99 to the tiling portion "A" (see FIG. 2) and a gate pad contact hole (see element 96 of FIG. 2) over the gate pad (see element 87 of FIG. 2) are formed. As described above, the cutting portion of the gate line 50, i.e., the tiling portion "A," is cut after the panel is completed. The cutting portion is utilized for tiling substrates to form a large-sized X-ray detector.

Referring now to FIG. 3E, a pixel electrode 62, which connects to the drain electrode 33 via the drain contact hole 85 and to the first capacitor electrode 60 via the capacitor electrode contact hole 95, is formed by depositing and patterning a transparent conductive material such as ITO or IZO. However, the transparent conductive material deposited on the cutting furrow 99 and on the gate pad contact hole (not shown) should be removed. Since the pixel electrode 62 is conductive, the pixel electrode 62 and the second capacitor electrode 60 have an equipotential.

Referring now back to FIG. 3D, as noted, the drain contact hole 85 is formed by etching the second insulation layer 83 and the protection layer 81, the capacitor electrode contact hole 95 is formed by etching the second insulation layer 83, and the cutting furrow 99 is formed by etching the second insulation layer 83, the protection layer 81 and the first insulation layer 75. Further, all those openings are all etched at the same time. However, when etching the different layers (the first insulation layer 75, the protection layer 81 and the second insulation layer 83) it is difficult to accurately control the etching process.

When dry etching, the etching process is controlled by monitoring a gas that is produced by a chemical reaction between the etching gas and the insulation or protection layers using an electrical device, referred to as an EPD (end point detector). The EPD converts the amount of the produced gas to an electrical voltage. Thus, the duration of the etching can be controlled based upon the electrical voltage. However, it is difficult to detect the gas that is produced while etching only the drain contact hole 85 and the capacitor electrode contact hole 95 because the amount of gas that is produced is so small. Thus, it is beneficial to enlarge the etching area by also etching the cutting furrow 99. This produces more gas, which improves the operation of the EPD.

However, some problems occur in the above-mentioned process. Note that three layers need to be etched when forming the cutting furrow and the gate pad contact hole, only one layer needs to be etched for the capacitor electrode contact hole, and only two layers need to be etched for the drain contact hole. When forming the cutting furrow and the gate pad contact hole using the dry etching method, the other contact holes are over-etched due to the fact that the protection layer and the insulation layers do not have etching selectivity with each other. Thus, the drain electrode and/or the second capacitor electrode can be deteriorated by over-etching, with the result being a possible manufacturing defect in the array substrate.

SUMMARY OF THE INVENTION

This invention has been developed in order to address the above-described problem.

An object of this invention is to provide an array substrate for use in an X-ray sensing device wherein over-etching while forming contact holes is prevented. Furthermore, it is an object of the present invention to provide a structure resistant to open gate lines caused by static electricity.

In order to accomplish at least one of the above objects, the principles of the present invention provide a method of fabricating an array substrate for use in an X-ray sensing device. Such a method includes forming a gate line having a gate electrode and a gate pad on a substrate. A first insulation layer is then formed on the gate line, on the gate electrode, on the gate pad, and on the substrate. An active layer is then formed on the first insulation layer and over the gate electrode. Source and drain electrodes, a data line, and a ground line are then formed. The source and drain electrodes are located on the active layer, over the gate electrode, and spaced apart from each other. The data line, which is formed in electrical contact with the source electrode, and the gate line define a pixel region. The ground line is formed such that it crosses the pixel region in one direction. A thin film transistor is then completed by etching a channel. A first capacitor electrode and an etching stopper are then formed. The first capacitor electrode contacts the ground line and the etching stopper is located in a tiling portion and over the gate line (or its gate pad). A protection layer is then formed on the thin film transistor, on the first capacitor electrode, on the first insulation layer, and on the etching stopper. A second capacitor electrode that corresponds in size to the first capacitor electrode is then formed on the protection layer and over the first capacitor electrode. A second insulation layer is then formed on the protection layer and on the second capacitor electrode. Then, a drain contact hole, a capacitor electrode contact hole, a cutting furrow, and a gate pad contact hole are formed. The drain contact hole is formed over the drain electrode by etching the second insulation layer and the protection layer. The capacitor electrode contact hole is formed over the second capacitor electrode by etching the protection layer. The cutting furrow and the gate pad contact hole are formed over the etching stopper by etching the second insulation layer and the protection layer. Then, a transparent conductive material is deposited on the second insulation layer and in the contact holes and cutting furrow. A pixel electrode is then formed by patterning the transparent conductive material such that the pixel electrode contacts the drain electrode through the drain contact hole and contacts the second capacitor electrode through the capacitor electrode contact hole. The method continues by simultaneously etching the transparent conductive material and the etching stopper in the cutting furrow; and then etching the portion of the first insulation layer in the cutting furrow and over the gate pad.

Beneficially, the first insulation layer is comprised of a material selected from a group consisting of Silicon Nitride (SiNx), Silicon Oxide (SiOx), BCB (Benzocyclobutene) and acryl.

Beneficially, the first and second capacitor electrodes and the pixel electrode are comprised of a transparent conductive material such as Indium-Tin-Oxide (ITO) or Indium-Zinc-Oxide (IZO).

In order to accomplish the above objects, the principles of the present invention further provide a method of fabricating an array substrate, including: forming a gate-protruded portion extended from a gate line near the etching stopper; forming a gate line contact hole over the gate-protruded portion by etching the first insulation layer; and forming a stopper-protruded portion over the gate-protruded portion, the stopper-protruded portion extended from the etching stopper, wherein the etching stopper electrically contacts the gate line through the gate line contact hole.

Beneficially, the protection layer is made of Silicon Nitride (SiNx).

Beneficially, the second insulation layer is made of BCB (Benzocyclobutene).

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which.

DETAILED DESCRIPTION OF ILLUSTRATED EMBODIMENTS

Reference will now be made in detail to illustrated embodiments of the present invention, examples of which are shown in the accompanying drawings.

Figure 1:
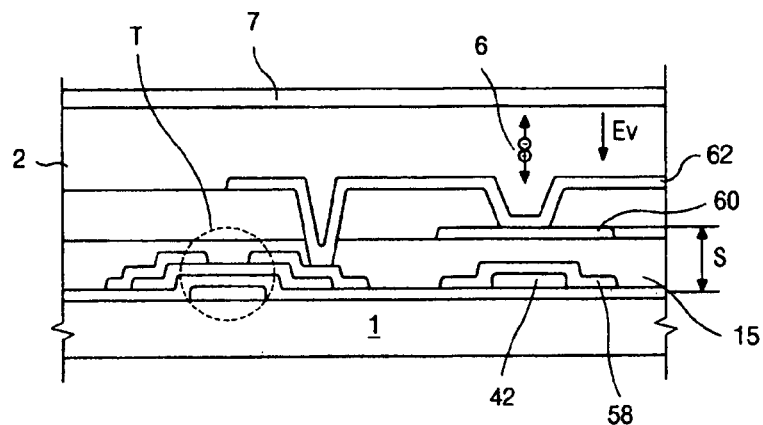
FIG. 1 is a cross-sectional view of one pixel of a conventional X-ray sensing device.
Figure 2:
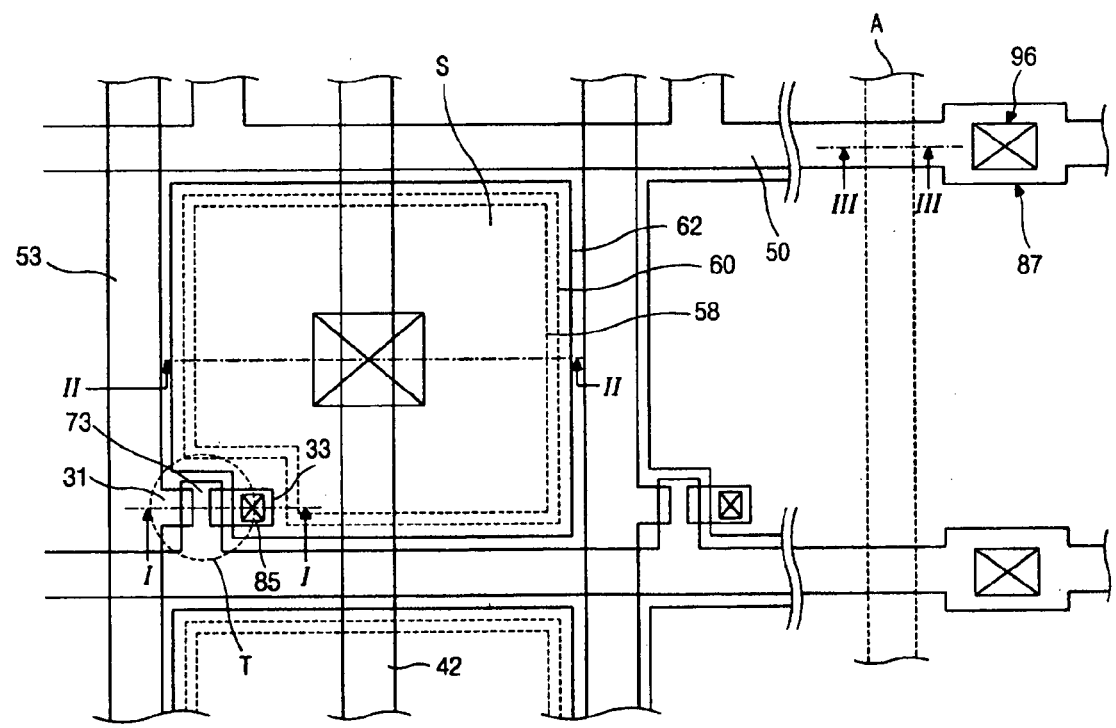
FIG. 2 is a plan view of a conventional array substrate having pixels as in FIG. 1.
Figure 3A:
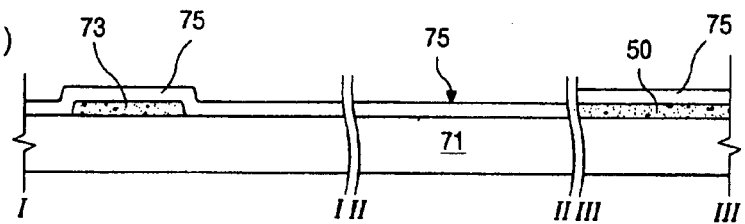
FIGS. 3A to 3E are cross sectional views taken along lines I—I, II—II and III—III of FIG. 2 and illustrate the manufacturing steps for that array substrate.
Figure 3B:
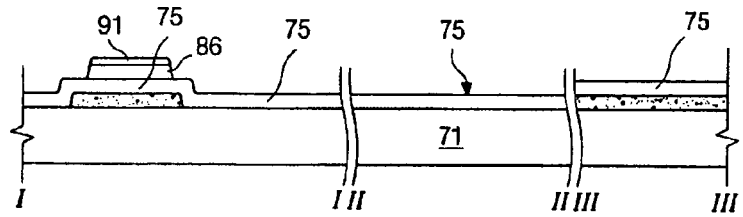
Figure 3C:
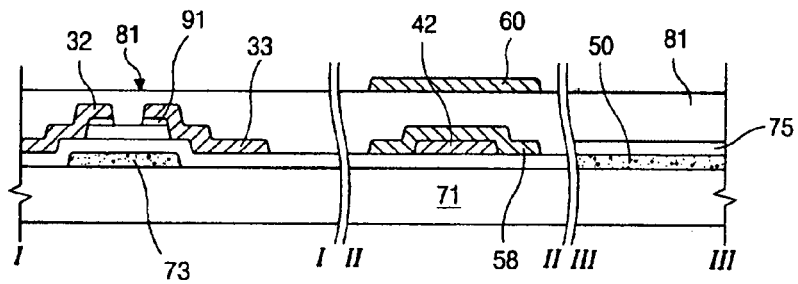
Figure 3D:
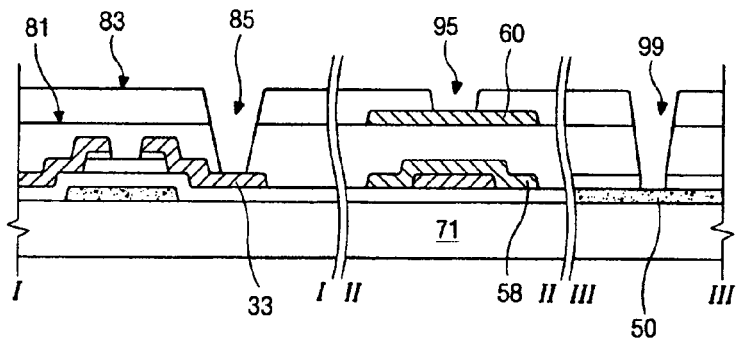
Figure 3E:
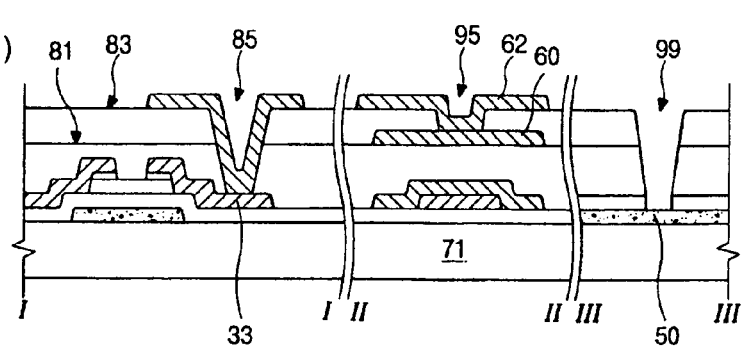
Figure 4:
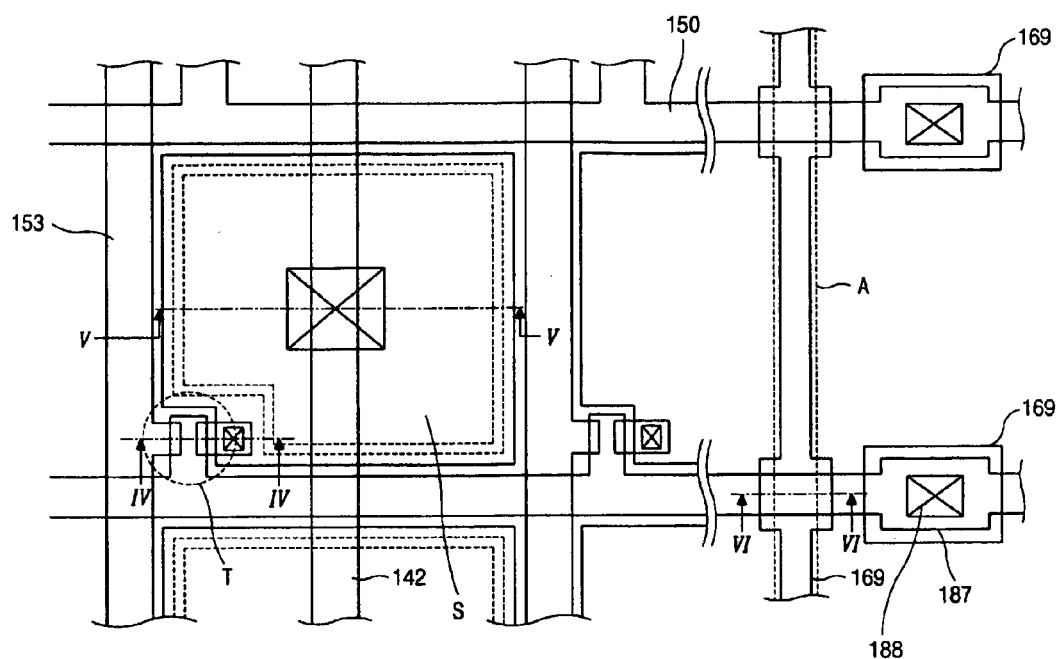
FIG. 4 is a partial plan view of an array substrate for use in an X-ray detector that is in accord with the principles of the present invention.

FIG. 4 is a partial plan view of an array substrate for use in the X-ray detector that is in accord with the principles of the present invention. As shown in FIG. 4, a gate line 150 and a data line 153 cross each other and define a storage capacitor area "S." A TFT "T" is positioned near the crossing of the gate and data lines 150 and 153. A ground line 142 in parallel to the data line 153 crosses the storage capacitor "S." A tiling portion "A" that perpendicularly crosses the plural gate lines 150 has an etching stopper 169.

Figure 5A:
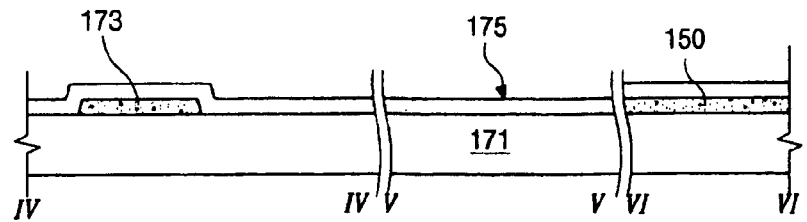
FIGS. 5A to 5F are cross sectional views taken along lines IV—IV, V—V and VI—VI of FIG. 4 and illustrate the manufacturing steps for that array substrate.

FIGS. 5A to 5F are cross sectional views taken along lines IV—IV, V—V and VI—VI of FIG. 4 and illustrate the manufacturing steps for that array substrate. Referring now to FIG. 5A, a first metal layer is formed on a substrate 171 by depositing a metallic material such as Aluminum (Al), Al-alloy, Molybdenum (Mo), Tantalum (Ta), Tungsten (W) or Antimony (Sb). The first metal layer is patterned to form a gate line 150 and a gate electrode 173 that extends from the gate line 150. Referring now back to FIG. 4, a gate pad 187 at each end of the gate line 150 is also formed by patterning the first metal layer. The gate pads at one end of the gate lines are subsequently cut off, with the cutting portion being the tiling portion "A." The tiling portion is utilized for tiling substrates together to form a large array substrate.

Referring now once again to FIG. 5A, after the first metal layer is patterned a first insulation layer 175 is formed on the substrate 171 and over the patterned first metal layer. Beneficially, the first insulation layer is an inorganic substance such as Silicon Nitride (SiNx) or Silicon Oxide (SiOx), or an organic substance such as BCB (Benzocyclobutene) or an acryl. Silicon Nitride (SiNx) is beneficially employed in the embodiment of FIG. 4.

Figure 5B:
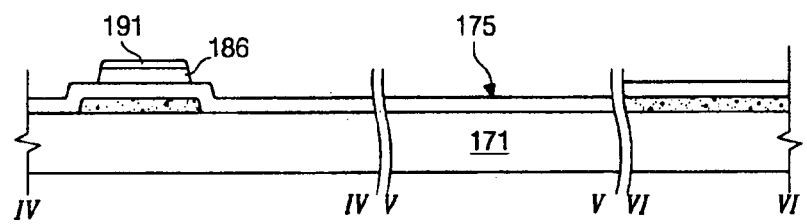

Referring now to FIG. 5B, a pure amorphous silicon (a-Si:H) layer and a doped amorphous silicon (n+ a-Si:H) layer are then sequentially formed over the first insulation layer 175. Those silicon layers are then patterned to form an active layer 186 and an ohmic contact layer 191. Either CVD (Chemical Vapor Deposition) or an Ion Injection Method are beneficial in forming the doped amorphous silicon layer.

Figure 5C:
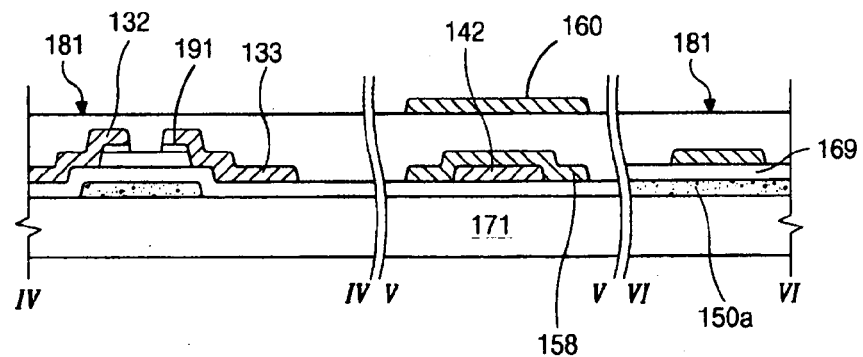

Referring now to FIG. 5C, a source electrode 132, a drain electrode 133, and a ground line 142 are then simultaneously formed. First, a second conductive metal layer of Aluminum (Al), Al-alloy, Molybdenum (Mo), Tantalum (Ta), Tungsten (W) or Antimony (Sb) is deposited. That second conductive metal layer is then patterned to form the source electrode 132, the drain electrode 133, and the ground line 142. Referring now to both FIG. 4 and FIG. 5C, the source electrode 132 is formed over the gate electrode 173 as an extension of the data line 153. The drain electrode 133 is formed over the gate electrode 173 and spaced apart from the source electrode 132. The ground line 142 crosses under the storage capacitor area "S." A portion of the ohmic contact layer 191 on the active layer 186 is then etched to form a channel region using the source and drain electrodes 132 and 133 as masks. Thus, the TFT "T" (see FIG. 4) is completed.

Still referring to FIG. 5C, a first capacitor electrode 158 is then formed on the ground line 142 by depositing and patterning a transparent conductive material such as Indium-Tin-Oxide (ITO) or Indium-Zinc-Oxide (IZO). As shown, the first capacitor electrode 158 is in contact with the ground line 142. When forming the first capacitor electrode 158, an etching stopper 169 is simultaneously formed on the first insulation layer 175 and in the tiling portion "A" (see FIG. 4) using the transparent conductive material. Although not depicted in FIG. 5C, but as shown in FIG. 4, the etching stopper 169 is also formed over the gate pads 187 that are arranged at one end of the gate lines.

Still referring to FIG. 5C, a Silicon Nitride (SiN$_x$) dielectric protection layer 181 is then formed over the TFT "T," over the first capacitor electrode 158, over the etching stopper 169, and over the first insulation layer 175. Thus, the first insulation layer 175 and the protection layer 181 are stacked over the gate pad (see 187 of FIG. 4) and over the gate line 150. A second capacitor 160 that corresponds in size to the first capacitor electrode 158 is then formed on the protection layer 181 over the first capacitor electrode 158. Beneficially, the second capacitor electrode 160 is comprised of the same material as the first capacitor electrode 158.

Figure 5D:
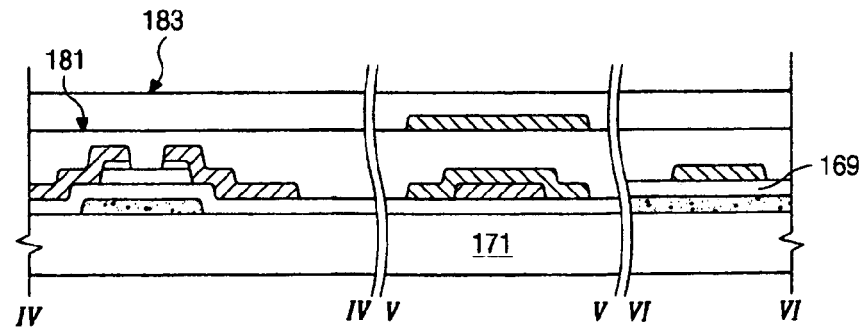

Referring now to FIG. 5D, a second insulation layer 183 is formed on the protection layer 181 and over the second capacitor electrode 160, beneficially by depositing an organic substance such as BCB (Benzocyclobutene). BCB has a low dielectric permittivity, while Silicon Nitride (SiN$_x$), Silicon Oxide (SiO$_x$), and an acryl do not.

Figure 5E:
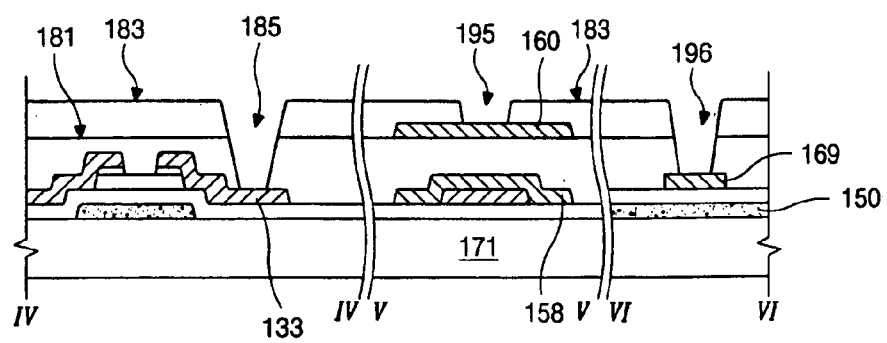

Referring now to FIG. 4 and FIG. 5E, a drain contact hole 185 to the drain electrode 133 is formed by etching the second insulation layer 183 and the protection layer 181. Simultaneously, a capacitor electrode contact hole 195 to the second capacitor electrode 160 is formed by etching the second insulation layer 183. Also simultaneously, a cutting furrow 196 to the gate electrode 150 of the tiling portion "A," and a gate pad contact hole 188 to the gate pad 187 are formed by etching the second insulation layer 183 and the protection layer 181. Since the etching stopper 169 is positioned on the first insulation layer 175 over the gate line 150, only the protection layer 181 and the second insulation layer 183 are etched, contrary to the conventional art.

Figure 5F:
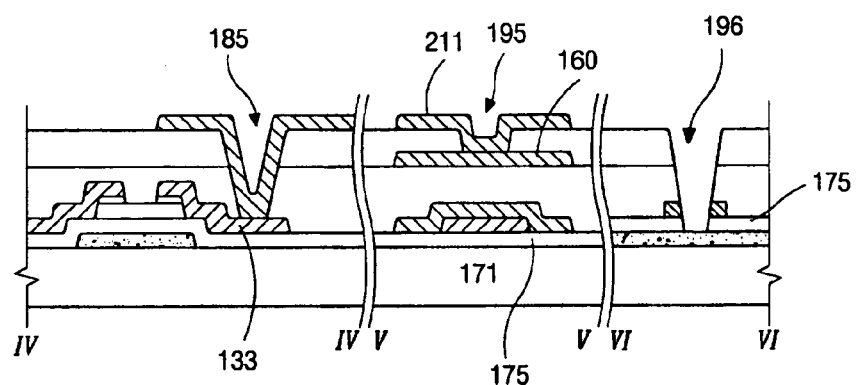

Referring now to FIG. 5F, a pixel electrode 211 is formed by depositing and patterning a transparent conductive material such as ITO or IZO. The pixel electrode 211 is formed to be in electrical contact with the drain electrode 133, via the drain contact hole 185, and with the first capacitor electrode 160, via the capacitor electrode contact hole 195. Thus, the pixel electrode 211 and the second capacitor electrode 160 can have equipotentials. The transparent conductive material deposited in the cutting furrow 196 and in the gate pad contact hole 188 (see FIG. 4), and part of the etching stopper 169, are removed. Then a portion of the first insulation layer 175 at the cutting furrow 196 is etched to form a gate pad contact hole 188 (see FIG. 4).

By employing the etching stoppers 169 at the cutting furrow and at the gate pad contact hole, only two layers (the protection layer 181 and the second insulation layer 183) are etched at the cutting furrow and at the gate pad contact hole during forming of the drain contact hole 185 and the capacitor electrode contact hole 195. Thus, although the EPD method is enabled, over-etching does not occur at the drain electrode 133 or at the second capacitor electrode 160. Thus, etching can be easily controlled.

Figure 6:
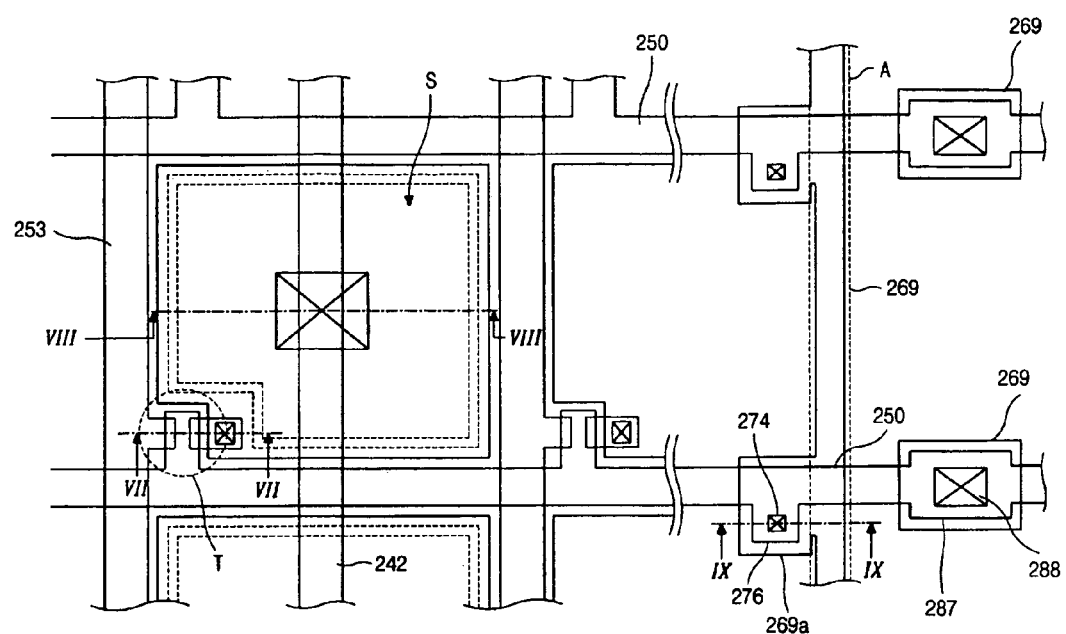
FIG. 6 is a partial plan view of an array substrate for use in another X-ray detector that is in accord with the principles of the present invention.

FIG. 6 is a partial plan view of another embodiment array substrate for use in an X-ray sensing device that is in accord with the principles of the present invention. As shown in FIG. 6, gate lines 250 cross a data line 253 so as to define a storage capacitor area "S." A TFT "T" is positioned near the crossing of a gate line 250 and the data lines 253. A ground line 242 that is parallel to the data line 253 crosses the storage capacitor area "S." In this embodiment a tiling portion "A," discussed previously, perpendicularly crosses the plural gate lines 250. The gate lines 250 include gate-protruded portions 276. The tiling portion "A" includes an etching stopper 269 that has a stopper-protruded portions 269a that extends over the gate line 250. The stopper-protruded portion 269a connects to the gate-protruded portion 276 through a gate line contact hole 274 such that it electrically contacts the gate line 250. Thus, the gate lines and the tiling portion "A" have equipotentials. This structure prevents static electricity being generated during a dry etch process.

With reference to FIGS. 7A to 7F, a method of fabricating the embodiment illustrated in FIG. 6 will be described. FIGS. 7A to 7F are cross sectional views taken along lines VII—VII, VIII—VIII and IX—IX of FIG. 6.

Figure 7A:
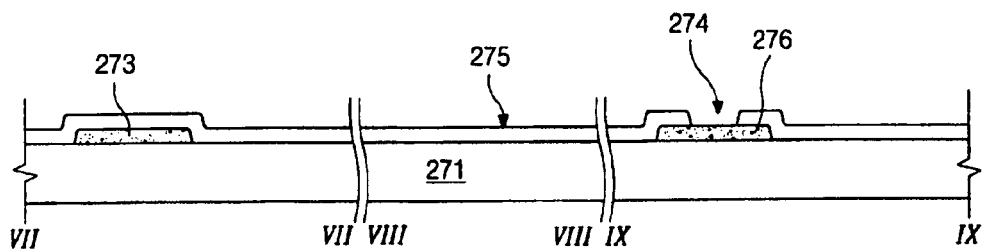
FIGS. 7A to 7F are cross sectional views taken along lines VII—VII, VIII—VIII and IX—IX of FIG. 6 and illustrate the manufacturing steps for that array substrate.

Referring now to FIG. 7A, a first metal layer is formed on a substrate 271 by depositing a metallic material such as Aluminum (Al), Al-alloy, Molybdenum (Mo), Tantalum (Ta), Tungsten (W) or Antimony (Sb). The first metal layer is then patterned to form a gate line 250 (see FIG. 6), a gate electrode 273 extended from the gate line 250, a gate pad 287 (see FIG. 6) at each end of the gate line 250, and the gate-protruded portion 276 extended from the gate line 250 (see FIG. 6) near the tiling portion "A" (see FIG. 6). The gate pads formed at one end of the gate lines are cut off in a later step. The cutting portion of the gate lines 250 is the tiling portion "A" (see FIG. 6), which is utilized for tiling substrates to form a large array substrate.

Still referring to FIG. 7A, a first insulation layer 275 is then formed on the substrate 271 and over the patterned first metal layer by depositing an inorganic substance such as Silicon Nitride (SiNx) or Silicon Oxide (SiOx), or an organic substance such as BCB (Benzocyclobutene) or an acryl. Silicon Nitride (SiNx) is beneficially employed in this embodiment of the present invention. The first insulation layer 275 is then patterned to form a gate line contact hole 274 that exposes the gate-protruded portion 276.

Figure 7B:
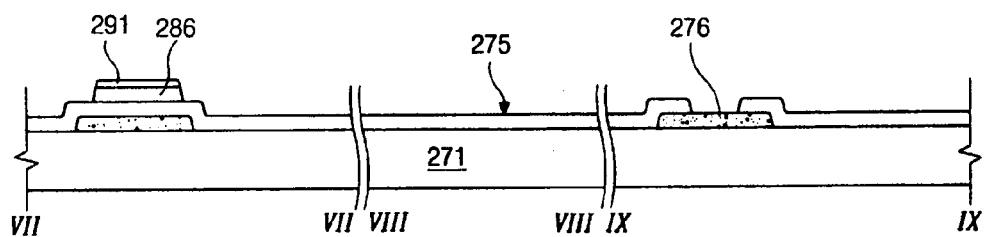

Referring now to FIG. 7B, a pure amorphous silicon (a-Si:H) layer and a doped amorphous silicon (n$^+$ a-Si:H) layer are then sequentially formed on the first insulation layer 275. Those silicon layers are then patterned to form an active layer 286 and an ohmic contact layer 291. CVD (Chemical Vapor Deposition) or the Ion Injection Method are beneficially used to form the doped amorphous silicon layer.

Figure 7C:
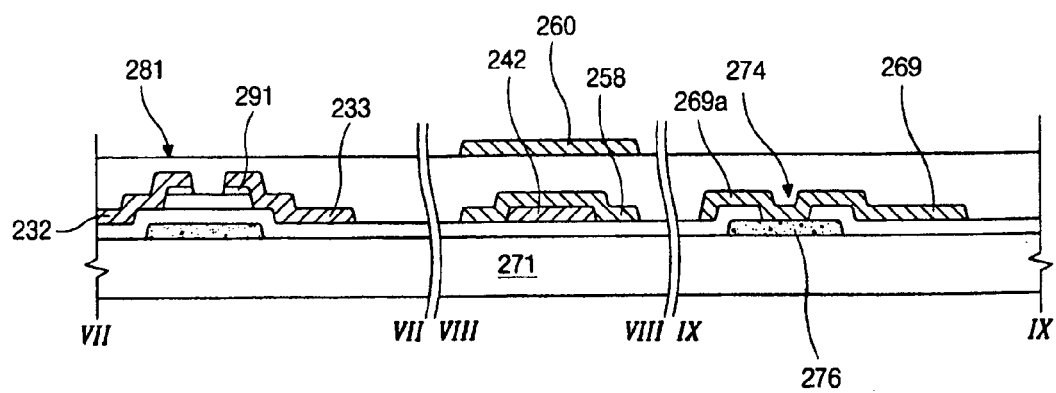

Referring now to FIG. 7C, a source electrode 232, a drain electrode 233, and a ground line 242 are then simultaneously formed. First, a second conductive metal layer, such as Aluminum (Al), Al-alloy, Molybdenum (Mo), Tantalum (Ta), Tungsten (W) or Antimony (Sb), is deposited. The second conductive metal layer is then patterned to form the source electrode 232, the drain electrode 233, and the ground line 242. The source electrode 232 extends over the gate electrode 273 from the data line 253 (see FIG. 6). The drain electrode 233 extends over the gate electrode 273 and is spaced apart from the source electrode 232. The ground line 242 crosses under the storage capacitor area "S" (see FIG. 6). A portion of the ohmic contact layer 291 on the active layer 286 is then etched to form a channel region using the source and drain electrodes 232 and 233 as masks. Thus, the TFT "T" (see FIG. 6) is complete.

Still referring to FIG. 7C, the first capacitor electrode 258 is then formed over the ground line 242 by depositing and patterning a transparent conductive material such as Indium-Tin-Oxide (ITO) or Indium-Zinc-Oxide (IZO). The first capacitor electrode 258 is in electrical contact with the ground line 242. When forming the first capacitor electrode 258, an etching stopper 269 is simultaneously formed on the first insulation layer 275 and in the tiling portion "A" (see FIG. 6) by using the above-mentioned transparent conductive material. At this time, the stopper-protruded portion 269a is formed over the gate-protruded portion 276 through the gate line contact hole 274. Although not depicted in FIG. 7C, the etching stopper 269 is also formed over the gate pads at one end of the gate lines (see FIG. 6).

A dielectric layer or protection layer 281 is then formed over the TFT, over the first capacitor electrode 258, over the etching stopper 269, and over the first insulation layer 275 by depositing Silicon Nitride ($SiN_x$). Thus, the first insulation layer 275 and the protection layer 281 are stacked over the gate pad 287 (see FIG. 6) and over the gate line 250 (see FIG. 6). A second capacitor electrode 260 that corresponds in size with the first capacitor electrode 258 is then formed on the protection layer 281 over the first capacitor electrode 258. The second capacitor electrode 260 is beneficially comprised of the same material as the first capacitor electrode 258.

Figure 7D:
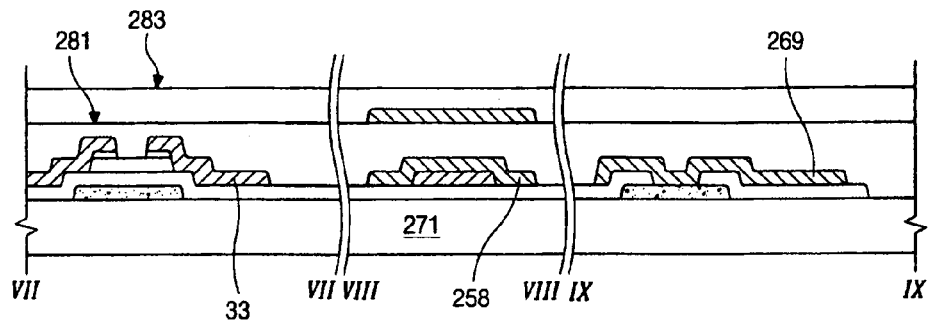

Referring now to FIG. 7D, a second insulation layer 283 is then formed by depositing an organic substance such as BCB (Benzocyclobutene). BCB beneficially has a low dielectric permittivity.

Figure 7E:
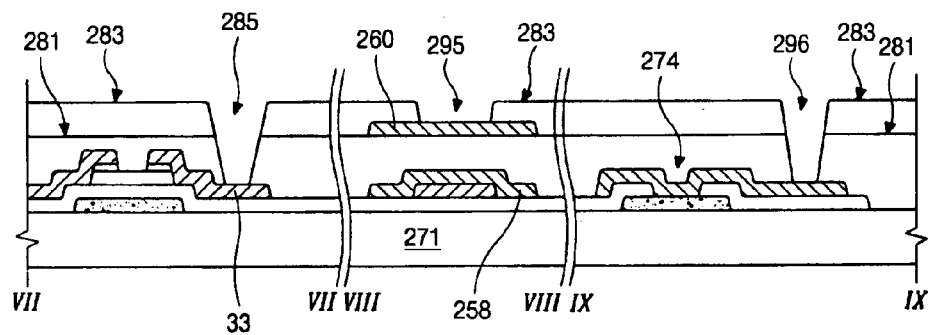

Referring now to FIG. 7E, a drain contact hole 285 to the drain electrode 233 is formed by etching the second insulation layer 283 and the protection layer 281. Simultaneously, a capacitor electrode contact hole 295 to the second capacitor electrode 260 is formed by etching the second insulation layer 283. Also simultaneously, a cutting furrow 296 to the gate line 250 (see FIG. 6) of the tiling portion "A" (see FIG. 6), and a gate pad contact hole 288 (see FIG. 6) to the gate pad 287 (see FIG. 6), are formed by etching the second insulation layer 283 and the protection layer 281. Since the etching stopper 269 is positioned on the first insulation layer 275 and over the gate line 288 (see FIG. 6), only the protection layer 281 and the second insulation 283 are etched, contrary to the conventional art.

Figure 7F:
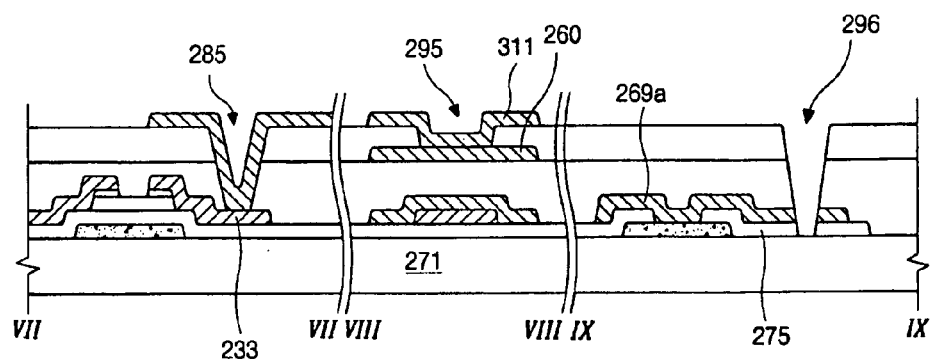

Referring now to FIG. 7F, a pixel electrode 311, which connects to the drain electrode 233 via the drain contact hole 285 and to the first capacitor electrode 260 via the capacitor electrode contact hole 295, is formed by depositing and patterning a transparent conductive material such as ITO or IZO. Thus, the pixel electrode 311 and the second capacitor electrode 260 can have an equipotential. The transparent conductive material that is deposited in the cutting furrow 296 and in the gate pad contact hole 288 (see FIG. 6) is removed, as is part of the etching stopper 269. Then, a portion of the first insulation layer 275 in the cutting furrow 296 is etched when forming the gate pad contact hole 288 (see FIG. 6). As described previously, since the etching stopper 269 electrically contacts the gate line (see 287 of FIG. 6), they have equipotentials.

As described above, since the first embodiment of the present invention employs the etching stopper on the first insulation layer, the etching ratio of the protection layer and the second insulation layer, which are stacked over the drain electrode an dover the capacitor electrode, is controlled. Thus, over-etch caused by a difference in the number of etching layers is prevented. The EPD can also be employed.

Moreover, since the gate line is electrically connected to the etching stopper through the gate line contact hole in the second embodiment, gate line open-circuits caused by static electricity during a dry etching process are prevented. Therefore, the manufacturing yield is raised, and the manufacturing defect caused in the array substrate is decreased. The EPD can also be employed.

Other embodiments and features of the invention will be apparent to the skilled in the art from consideration of the specification and practice of the invention disclosed herein. It is intended that the specification and examples be considered as exemplary only, with the true scope and spirit of the invention being indicated by the following claims.

What is claimed is:

1. An array substrate comprising:
   a plurality of gate lines on a substrate, each gate line having at least one gate electrode and a gate-protruded portion;
   a first insulation layer over the gate lines, over the gate electrodes, over the gate protruded portions, and over the substrate;
   a plurality of gate line contact holes, each passing through said first insulation to said gate-protruded portions;
   a conductive shorting element having a plurality of stopper-protruded portions that electrically connect to the gate lines via the gate-protruded portions, wherein said conductive shorting element electrically connects said plurality of gate lines together, and wherein said conductive shorting element is comprised of a conductive material;
   a plurality of thin film transistors on said first insulation layer, each thin film transistor located over a gate electrode and having a source electrode, a drain electrode, an ohmic contact layer, and a channel region in an active layer;
   a plurality of drain electrodes, each contacting an ohmic contact layer of an associated thin film transistor;
   a plurality of data lines on said first insulation layer, each data line having a plurality of source electrodes that electrically contact to a plurality of ohmic contact layers, wherein said plurality of data lines cross said plurality of gate lines to define a plurality of pixel regions;
   a ground line under each pixel region, said ground line being on said first insulation layer;
   a first capacitor electrode over said ground line and over a portion of said first insulation layer, said first capacitor electrode electrically connecting to said ground line, wherein said first capacitor electrode is comprised of said conductive material;
   a protection layer over said thin film transistor, over said data lines, over said source electrodes, over said drain electrodes, over said conductive shorting element, and over said first capacitor electrode;
   a plurality of second capacitor electrodes on said protection layer and over said first capacitor electrodes;
   a second insulating layer over said protection layer and over said second capacitor electrodes; and
   a cutting furrow through said second insulating layer and through said protection layer to said conductive shorting element.

2. An array substrate according to claim 1, further including a capacitor electrode contact hole through said second insulation layer to said second capacitor electrode.

3. An array substrate according to claim 2, further including a drain contact hole through said second insulation layer and through said protection layer to a first drain electrode of said plurality of drain electrodes.

4. An array substrate according to claim 3, further including a pixel electrode, wherein said pixel electrode electrically contacts said first drain electrode through said drain contact hole in said protection layer.

5. A photo detector having a plurality of pixels, comprising:
- a thin film transistor (TFT) on an array substrate having a gate electrode, a source electrode, a drain electrode, a first insulation layer, an active layer and a pixel electrode, the first insulation layer being between the gate electrode and the active layer, the pixel electrode electrically connected to the drain electrode of the TFT;
- a storage capacitor having a ground line, a first capacitor electrode on the ground line, a second capacitor electrode and a protective layer between the first and second capacitor electrodes, the pixel electrode electrically connected to the second capacitor electrode;
- a photo-conductive layer on the pixel electrode for converting light into electron-hole pairs;
- a conductive electrode on the photo-conductive layer for applying an electric field to the photo-conductive layer along with the pixel electrode; and
- a tiling portion for tiling the array substrate, the tiling portion having an etching stopper between the first insulation layer and the protection layer, the etching stopper including a transparent conductive material.

6. A photo detector according to claim 5, wherein the first insulation layer is made of a material selected from a group consisting of Silicon Nitride (SiNx), Silicon Oxide (SiOx), BCB (Benzocyclobutene) and an acryl.

7. A photo detector according to claim 5, wherein the first capacitor electrode, the second capacitor electrode and the pixel electrode are made of a transparent conductive material.

8. A photo detector according to claim 7, wherein the transparent conductive material is Indium-Tin-Oxide (ITO) or Indium-Zinc-Oxide (IZO).

9. A photo detector according to claim 5, wherein the protection layer is made of Silicon Nitride (SiNx).

10. A photo detector according to claim 5, further including a second insulation layer between the pixel electrode and the second capacitor electrode.

11. A photo detector according to claim 10, wherein the second insulation layer is made of BCB (Benzocyclobutene).

12. A photo detector according to claim 5, wherein the etching stopper is formed at the same time as the first capacitor electrode.

13. A photo detector according to claim 5, wherein the etching stopper is electrically connected to a gate line of the array substrate.

* * * * *